(12) United States Patent
Watanabe et al.

(10) Patent No.: US 8,053,685 B2
(45) Date of Patent: Nov. 8, 2011

(54) METAL WIRING PLATE

(75) Inventors: Tatsuya Watanabe, Anjo (JP);
Masahiko Imoto, Kariya (JP); Hideyuki Iiboshi, Tokai (JP); Shinichi Awano, Kariya (JP)

(73) Assignee: Denso Corportion, Kariya (JP)

( * ) Notice: Subject to any disclaimer, the term of this patent is extended or adjusted under 35 U.S.C. 154(b) by 775 days.

(21) Appl. No.: 12/148,804

(22) Filed: Apr. 22, 2008

(65) Prior Publication Data

US 2008/0264683 A1 Oct. 30, 2008

(30) Foreign Application Priority Data

Apr. 25, 2007 (JP) ................. 2007-115902

(51) Int. Cl.
*H01L 23/34* (2006.01)

(52) U.S. Cl. ......... 174/526; 174/260; 174/547; 361/752

(58) Field of Classification Search ................. 174/255, 174/261, 267, 260, 526, 546, 547, 548; 361/799, 361/800, 752–759
See application file for complete search history.

(56) References Cited

U.S. PATENT DOCUMENTS

| | | | | |
|---|---|---|---|---|
| 3,887,760 | A * | 6/1975 | Krieger et al. | 174/261 |
| 4,210,926 | A * | 7/1980 | Hacke | 257/673 |
| 5,804,880 | A | 9/1998 | Mathew | |
| 6,011,222 | A * | 1/2000 | Sekiya et al. | 174/266 |
| 6,324,754 | B1 | 12/2001 | DiStefano et al. | |
| 6,409,073 | B1 | 6/2002 | Kaskoun et al. | |
| 6,787,700 | B2 * | 9/2004 | Nagao et al. | 174/541 |
| 6,828,668 | B2 * | 12/2004 | Smith et al. | 257/696 |
| 2003/0073349 | A1 | 4/2003 | Nagao et al. | |
| 2004/0119155 | A1 | 6/2004 | Hisada et al. | |

FOREIGN PATENT DOCUMENTS

| | | |
|---|---|---|
| FR | 2 748 105 | 10/1997 |
| JP | 59-36268 | 3/1964 |
| JP | 54-111756 | 9/1979 |
| JP | 54-161069 | 12/1979 |
| JP | 59-107769 | 6/1984 |
| JP | S59-96869 | 6/1984 |
| JP | 60-116273 | 8/1985 |
| JP | 62-80321 | 5/1987 |
| JP | 05-167234 | 7/1993 |
| JP | 2003-124416 | 4/2003 |
| JP | 2004-140226 | 5/2004 |

(Continued)

OTHER PUBLICATIONS

Office action dated Dec. 4, 2008 in Japanese Application No. 2007-115902.

(Continued)

*Primary Examiner* — Jeremy Norris
(74) *Attorney, Agent, or Firm* — Harness, Dickey & Pierce, PLC

(57) ABSTRACT

A metal wiring plate includes a soldering portion to which an electronic device is soldered and a wiring portion extending from the soldering portion and configured to electrically connect the electronic device to other device. The wiring portion includes a narrow portion located adjacent to the soldering portion. The width of the narrow portion is less than the width of the soldering portion so that the narrow portion helps prevent melted solder applied to the soldering portion from spreading to areas outside the soldering portion. The narrow portion allows the electronic apparatus to be surely soldered to the soldering portion without using solder resist.

8 Claims, 5 Drawing Sheets

FOREIGN PATENT DOCUMENTS

JP      2004-363488      12/2004

OTHER PUBLICATIONS

Office action dated Jan. 21, 2010 in corresponding Japanese Application No. 2009-93083.
Office action dated Jul. 29, 2010 in corresponding Chinese Application No. 2008 10094639.5.
Office action dated Sep. 15, 2010 in corresponding European Application No. 08 007115.2.
Search Report dated Sep. 24, 2009 in European Application No. 08007115.2.
Office action dated Sep. 25, 2009 in corresponding Chinese Application No. 2008 10094639.5.
Search Report dated Dec. 1, 2009 in corresponding European Application No. 08007115.2.
Office action dated Jul. 5, 2011 in corresponding Chinese Application No. 200810094639.5.

* cited by examiner

METAL WIRING PLATE

CROSS REFERENCE TO RELATED APPLICATION

This application is based on and incorporates herein by reference Japanese Patent Application No. 2007-115902 filed on Apr. 25, 2007.

FIELD OF THE INVENTION

The present invention relates to a metal wiring plate for electrically connecting an electronic device to other device through solder.

BACKGROUND OF THE INVENTION

US 20040119155A1 corresponding to JP-A-2004-200464 discloses a metal wiring plate for electrically connecting an electronic device to other device through solder. The metal wiring plate is a cluster of wiring portions arranged and held in a predetermined wiring pattern. The wiring portion has a soldering portion to which an electronic device is soldered. When melted solder applied to the soldering portion spreads to areas outside the soldering portion, a suitable solder fillet is not formed at the soldering portion. As a result, the electronic component cannot be surely soldered to the metal wiring plate. To prevent this program, the areas outside the soldering portion are coated with solder resist. However, the solder resist coating needs a printing process, which increases manufacturing cost of the metal wiring plate.

SUMMARY OF THE INVENTION

In view of the above-described problem, it is an object of the present invention to provide a metal wiring plate to which an electronic device can be surely soldered without using solder resist.

According to a first aspect of the present invention, a metal wiring plate includes a soldering portion and a wiring portion. An electronic device is soldered to the soldering portion. The wiring portion extends from the soldering portion and is configured to electrically connect the electronic device to other device. The wiring portion includes a narrow portion located adjacent to the soldering portion. The width of the narrow portion is less than the width of the soldering portion.

According to a second aspect of the present invention, a metal wiring plate includes a soldering portion and a wiring portion. An electronic device is soldered to the soldering portion. The wiring portion extends from the soldering portion and is configured to electrically connect the electronic device to other device. The wiring portion includes a wall portion located adjacent to the soldering portion. The wall portion extends upward from the soldering portion and causes the wiring portion to be located at a higher elevation than the soldering portion.

According to a third aspect of the present invention, a metal wiring plate includes a soldering portion and a wiring portion. An electronic device is soldered to the soldering portion. The wiring portion extends from the soldering portion and is configured to electrically connect the electronic device to other device. The wiring portion includes a groove portion located adjacent to the soldering portion.

According to a fourth aspect of the present invention, a metal wiring plate includes a soldering portion and a wiring portion. An electronic device is soldered to the soldering portion. The wiring portion extends from the soldering portion and is configured to electrically connect the electronic device to other device. The wiring portion includes a plated layer on a surface located adjacent to the soldering portion. The plated layer is made of a material having a less solder wettability than a material of which the soldering portion is made.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

First Embodiment

Figure 1:
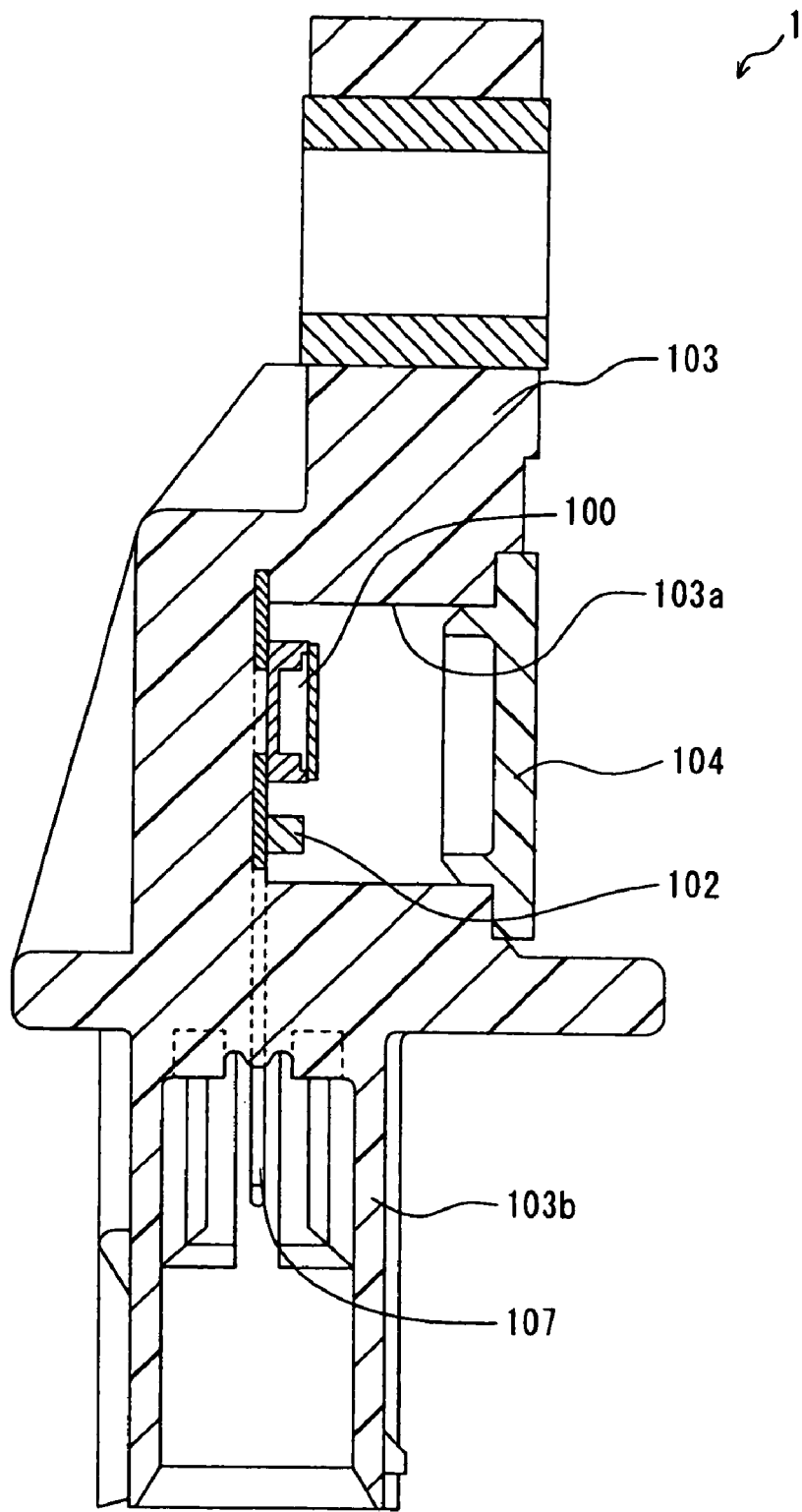
FIG. 1 is a diagram illustrating a cross sectional view of an acceleration sensor apparatus according to a first embodiment of the present invention.
Figure 2:
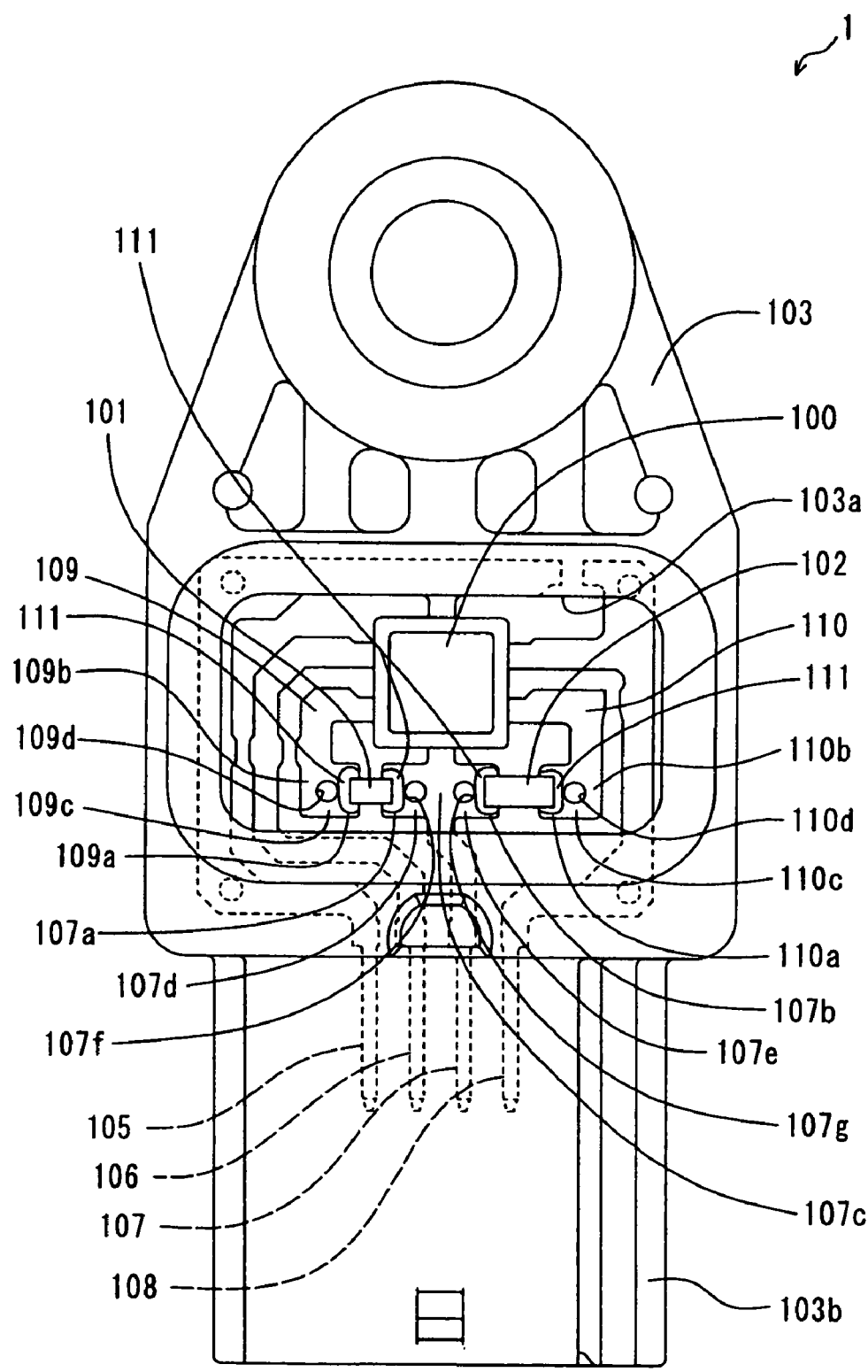
FIG. 2 is a diagram illustrating a back view of the acceleration sensor apparatus of FIG. 1, a lid of which is detached therefrom.

Referring to FIGS. 1 and 2, an acceleration sensor apparatus 1 according to a first embodiment of the present invention includes an acceleration sensing device 100, capacitors 101, 102, a housing 103, a lid 104, connector terminals 105-108, and terminals 109, 110.

The sensing device 100 detects acceleration and outputs a sensor signal corresponding to the detected acceleration. The sensing device 100 is a semiconductor sensor chip housed in a package such as a ceramic package. The capacitors 101, 102 allow the sensing device 100 to operate. The sensing device 100 and the capacitors 101, 102 construct an electronic circuit.

The housing 103 is made of resin and has a recess 103a with an opening. The sensing device 100 and the capacitors 101, 102 are housed in the recess 103a. The lid 104 is made of resin and covers the opening of the recess 103a. Thus, the recess 103a is sealed by the lid 104 so that the sensing device 100 and the capacitors 101, 102 can be protected from damage such as water, dust, or the like.

Each of the connector terminals 105-108 is a metal plate formed in a predetermined shape and electronically connects the sensing device 100 and an external apparatus. Further, the connector terminal 107 electrically connects the sensing device 100 and the capacitors 101, 102.

The connector terminal 107, which serves as a metal wiring plate, has a soldering portion 107a, 107b and a wiring portion 107c. The soldering portion 107a, 107b are located approximately in the middle of the connector terminal 107. First edge portions of the capacitors 101, 102 are soldered to the soldering portions 107a, 107b of the connector terminal 107, respectively. The wiring portion 107c is located between the soldering portions 107a, 107b, and the capacitors 101, 102 soldered to the soldering portions 107a, 107b are connected through the wiring portion 107c. Thus, the wiring portion 107c serves as an electric wire. The wiring portion 107c has a circular through hole 107f near the soldering portion 107a and has a circular through hole 107g near the soldering portion 107b. The circular through hole 107f forms a narrow portion 107d that is located adjacent to the soldering portion 107a and has a width less than that of the soldering portion 107a. Likewise, the circular through hole 107g forms a narrow portion 107e that is located adjacent to the soldering portion 107b and has a width less than that of the soldering portion 107b. Therefore, the narrow portions 107d, 107e and the connector terminal 107 are one-piece.

Each of the terminals 109, 110 is a metal plate formed in a predetermined shape and electronically connects the sensing device 100 and the capacitors 101, 102. The terminal 109, which serves as a metal wiring plate, has a soldering portion 109a and a wiring portion 109b. The soldering portion 109a is located at a first end of the terminal 109. A second edge portion of the capacitor 101 is soldered to the soldering portion 109a. The wiring portion 109b extends from the soldering portion 109a and provides an electrical connection between the capacitor 101 soldered to the soldering portion 109a and the sensing device 100. The wiring portion 109b has a circular through hole 109d near the soldering portion 109a. The circular through hole 109d forms a narrow portion 109c that is located adjacent to the soldering portion 109a and has a width less than that of the soldering portion 109a. The terminal 110, which serves as a metal wiring plate, has a soldering portion 110a and a wiring portion 110b. The soldering portion 110a is located at a first end of the terminal 110. A second edge portion of the capacitor 102 is soldered to the soldering portion 110a. The wiring portion 110b extends from the soldering portion 110a and provides an electrical connection between the capacitor 102 soldered to the soldering portion 110a and the sensing device 100. The wiring portion 110b has a circular through hole 110d near the soldering portion 110a. The circular through hole 110d forms a narrow portion 110c that is located adjacent to the soldering portion 110a and has a width less than that of the soldering portion 110a.

The connector terminals 105-108 are integrally fixed to the housing 103. Each of the connector terminals 105-108 has a first end exposed outside the housing 103 and a second end exposed to the recess 103a of the housing 103. The terminals 109, 110 are integrally fixed to the housing 103. A connector housing 103b is integrally formed with the housing 103 to surround the first ends of the connector terminals 105-108. The second ends of the connector terminals 105-108 and the terminals 109, 110 are located in the recess 103a. Each of the second ends of the connector terminals 105-108 and the terminals 109, 110 has a front side exposed to the inside of the recess 103a and a back side fixed to a bottom of the recess 103a. The sensing device 100 is soldered to the second ends of the connector terminals 105-108 and second ends of the terminals 109, 110. The capacitor 101 is soldered to the soldering portion 107a of the connector terminal 107 and the soldering portion 109a of the terminal 109 through solder 111. The capacitor 102 is soldered to the soldering portion 107b of the connector terminal 107 and the soldering portion 109b of the terminal 109 through solder 111. The opening of the recess 103a, where the sensing device 100 and the capacitors 101, 102 are accommodated, is covered with the lid 104 so that the recess 103a can be sealed.

According to the first embodiment, the narrow portions 107d, 107e, 109c, 110c are located adjacent to the soldering portions 107a, 107b, 109a, 110a, respectively. The narrow portions 107d, 107e, 109c, 110c help prevent melted solder 111 from spreading to areas outside the soldering portions 107a, 107b, 109a, 110a, respectively. Therefore, the capacitors 101, 102 can be surely soldered without using solder resist, which needs a printing process. The narrow portions 107d, 107e, 109c, 110c are formed by forming the through holes 107f, 107g, 109d, 110d in a stamping process, for example. Thus, since the narrow portions 107d, 107e, 109c, 110c can be formed in the same process as the terminals 107, 109, 110 are formed in the predetermined shape, additional process such as the printing process is not required. As a result, manufacturing cost can be reduced as compared to when the solder resist is used.

Figure 3:
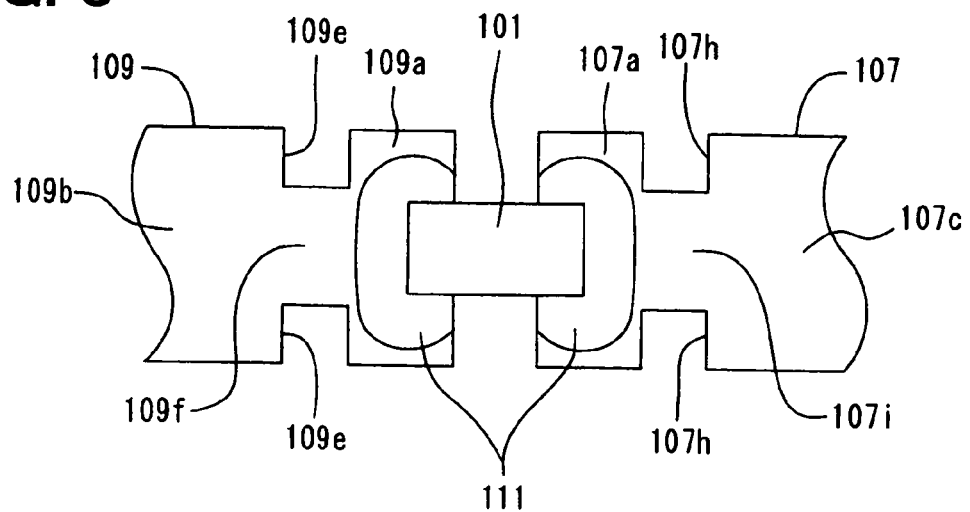
FIG. 3 is a diagram illustrating a partially enlarged view of an acceleration sensor apparatus according to a modification of the first embodiment.

The narrow portions can be formed by a method other than forming the through holes. For example, as shown in FIG. 3, narrow portions 107i, 109f are formed by forming rectangular cutout portions 107h, 109e in the wiring portions 107c, 109b, respectively.

Second Embodiment

A second embodiment of the present invention is described below with reference to FIGS. 4A, 4B. A difference between the first and second embodiments is that the narrow portions are replaced with wall portions.

Figure 4A:
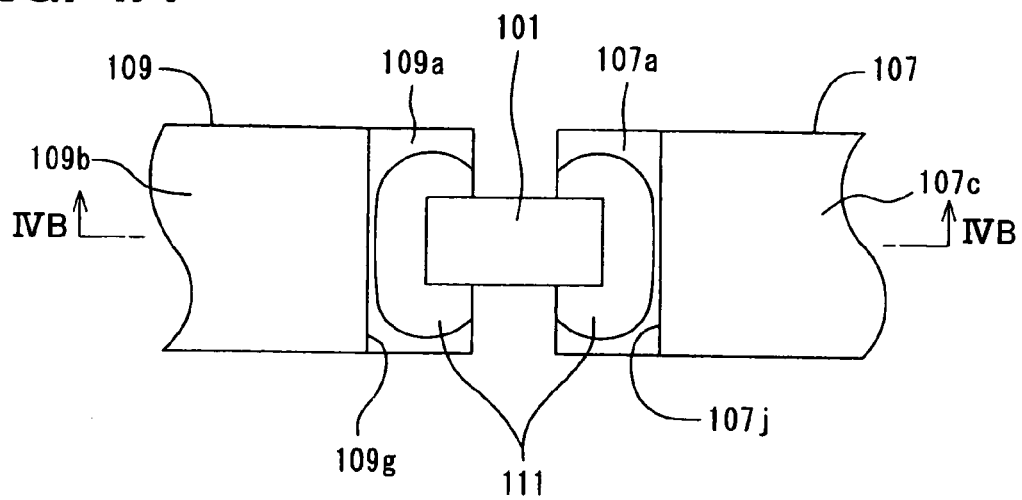
FIG. 4A is a diagram illustrating a partially enlarged view of an acceleration sensor apparatus according to a second embodiment of the present invention.
Figure 4B:
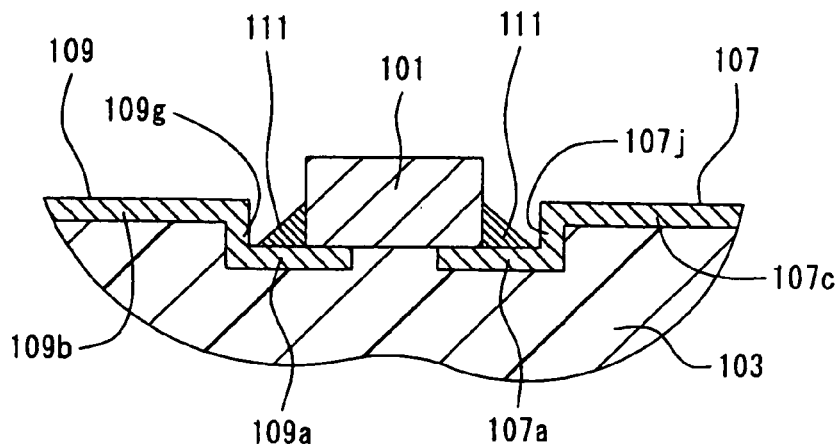
FIG. 4B is a diagram illustrating a cross-sectional view taken along line IVB-IVB of FIG. 4A.

As shown in FIGS. 4A, 4B, a connector terminal 107 has a soldering portion 107a and a wiring portion 107c. The wiring portion 107c is bent upward to form a wall portion 107j. The wall portion 107j is located adjacent to the soldering portion 107a and causes the wiring portion 107c to be located at a higher elevation than the soldering portion 107a. The wall portion 107j and the connector terminal 107 are one-piece. A terminal 109 has a soldering portion 109a and a wiring portion 109b. The wiring portion 109b is bent upward to form a wall portion 109g. The wall portion 109g is located adjacent to the soldering portion 109a and causes the wiring portion 109b to be located at a higher elevation than the soldering portion 109a. The wall portion 109g and the terminal 109 are one-piece. The capacitor 101 is soldered to the soldering portion 107a of the connector terminal 107 and the soldering portion 109a of the terminal 109 through solder 111. The capacitor 102 is soldered in the same manner as the capacitor 101.

According to the second embodiment, the wall portions 107j, 109g help prevent melted solder 111 from spreading to areas outside the soldering portions 107a, 109a, respectively. Therefore, the capacitor 101 can be surely soldered without using solder resists, which needs a printing process. The wall portions 107j, 109g are formed by bending the wiring portions 107c, 109b. Thus, since the wall portions 107j, 109g can be formed in the same process as the terminals 107, 109 are formed in the predetermined shape, additional process such as the printing process is not required. As a result, manufacturing cost can be reduced as compared to when the solder resist is used.

Third Embodiment

A third embodiment of the present invention is described below with reference to FIGS. 5A, 5B. A difference between the first and third embodiments is that the narrow portions are replaced with groove portions.

Figure 5A:
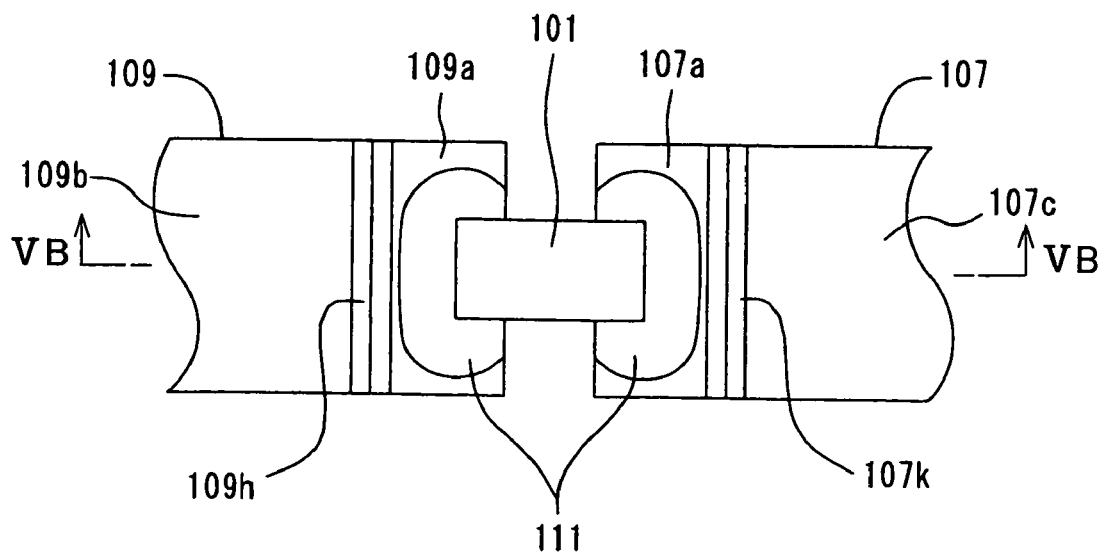
FIG. 5A is a diagram illustrating a partially enlarged view of an acceleration sensor apparatus according to a third embodiment of the present invention.
Figure 5B:
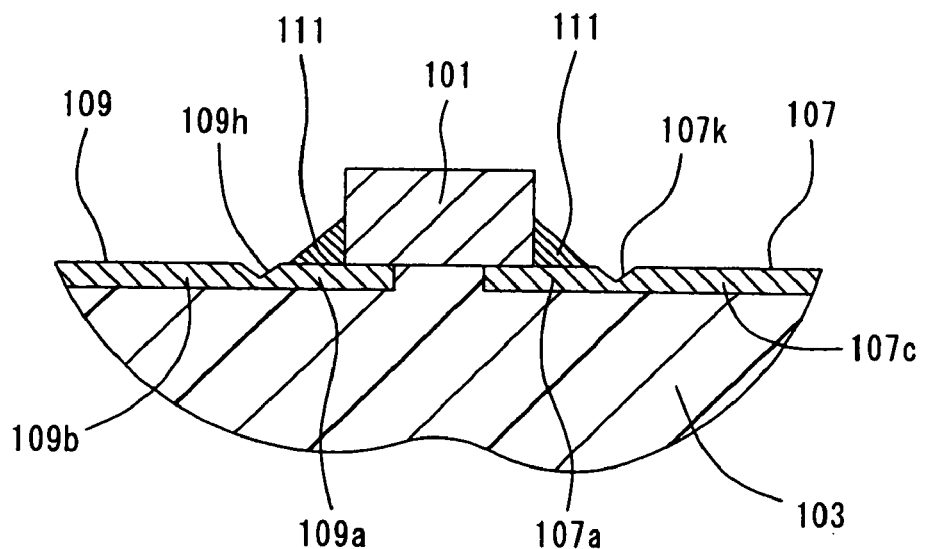
FIG. 5B is a diagram illustrating a cross-sectional view taken along line VB-VB of FIG. 5A.

As shown in FIGS. 5A, 5B, a connector terminal 107 has a soldering portion 107a and a wiring portion 107c. The wiring portion 107c has a groove portion 107k that is located adjacent to the soldering portion 107a. A depth of the groove portion 107k is less than a thickness of the wiring portion 107c. The groove portion 107k and the connector terminal 107 are one-piece. A terminal 109 has a soldering portion 109a and a wiring portion 109b. The wiring portion 109b has a groove portion 109h that is located adjacent to the soldering portion 109a. A depth of the groove portion 109h is less than a thickness of the wiring portion 109b. The groove portion 109h and the terminal 109 are one-piece. The capacitor 101 is soldered to the soldering portion 107a of the connector terminal 107 and the soldering portion 109a of the terminal 109 through solder 111. The capacitor 102 is soldered in the same manner as the capacitor 101.

According to the third embodiment, the groove portions 107k, 109h help prevent melted solder 111 from spreading to areas outside the soldering portions 107a, 109a, respectively. Therefore, the capacitor 101 can be surely soldered without using solder resist, which needs a printing process. Since the groove portions 107k, 109h can be formed in the same process as the terminals 107, 109 are formed in the predetermined shape, additional process such as the printing process is not required. As a result, manufacturing cost can be reduced as compared to when the solder resist is used.

Fourth Embodiment

A fourth embodiment of the present invention is described below with reference to FIGS. 6A, 6B. A difference between the first and fourth embodiments is that the narrow portions are replaced with plated portions.

Figure 6A:
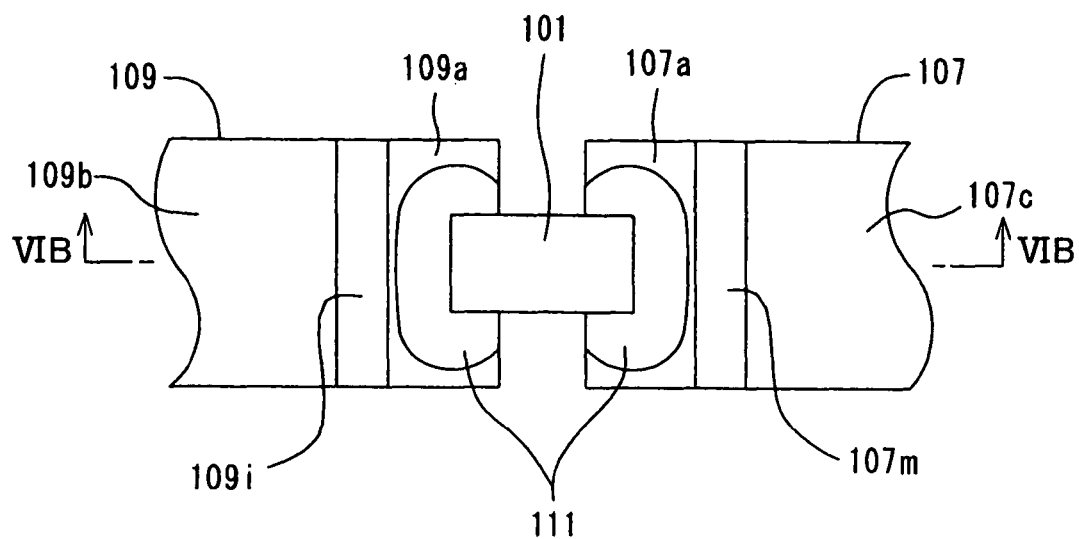
FIG. 6A is a diagram illustrating a partially enlarged view of an acceleration sensor apparatus according to a fourth embodiment of the present invention.
Figure 6B:
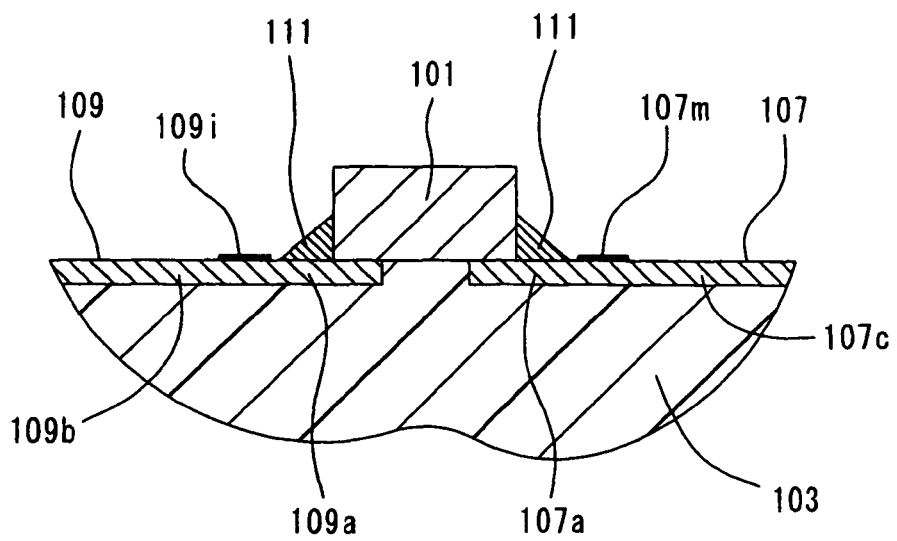
FIG. 6B is a diagram illustrating a cross-sectional view taken along line VIB-VIB of FIG. 6A.

As shown in FIGS. 6A, 6B, a connector terminal 107 has a soldering portion 107a and a wiring portion 107c. The wiring portion 107c has a plated portion 107m that is located adjacent to the soldering portion 107a and has a predetermined width. A surface of the plated portion 107m is plated with a material having a less solder wettability than the soldering portion 107a. A terminal 109 has a soldering portion 109a and a wiring portion 109b. The wiring portion 109b has a plated portion 109i that is located adjacent to the soldering portion 109a and has a predetermined width. A surface of the plated portion 109i is plated with a material having a less solder wettability than the soldering portion 109a. The capacitor 101 is soldered to the soldering portion 107a of the connector terminal 107 and the soldering portion 109a of the terminal 109 through solder 111. The capacitor 102 is soldered in the same manner as the capacitor 101.

According to the fourth embodiment, the plated portions 107m, 109i help prevent melted solder 111 from spreading to areas outside the soldering portions 107a, 109a, respectively. Therefore, the capacitor 101 can be surely soldered without using solder resist, which needs a printing process.

(Modifications)

The embodiments described above may be modified in various ways. For example, the metal wiring plate 107, 109, 110 can be applied to an apparatus other than an acceleration sensor apparatus.

Such changes and modifications are to be understood as being within the scope of the present invention as defined by the appended claims.

What is claimed is:

1. A metal wiring plate in combination with a housing, the combination comprising:
    a soldering portion to which an electronic device is soldered; and
    a wiring portion extending from the soldering portion and configured to electrically connect the electronic device to an other device,
    wherein the metal wiring plate is integrally fixed to the housing;
    wherein the wiring portion includes a wall portion located adjacent to the soldering portion, and
    wherein the wall portion extends upward from the soldering portion along an open step portion of the housing and causes the wiring portion to be located at a higher elevation than the soldering portion.
2. The combination according to claim 1,
    wherein the wall portion is formed by bending the wiring portion.
3. The combination according to claim 1,
    wherein the wall portion is configured to prevent melted solder applied to the soldering portion from spreading to areas outside the soldering portion.
4. The combination according to claim 1,
    wherein the housing has a recess with a side wall defined by the step portion,
    wherein the soldering portion is fixed to a bottom of the recess,
    wherein the wiring portion is fixed to a surface of the housing around an opening of the recess,
    wherein the wall portion is fixed to the side wall of the recess, and
    wherein the electronic device is located in the recess, and
    wherein the other electronic device is located outside the recess.
5. The combination according to claim 1,
    wherein the wall portion is exposed outside the housing.
6. The combination according to claim 1,
    wherein the soldering portion and the wiring portion are fixed directly to the housing.
7. The combination according to claim 6,
    wherein the wall portion directly engages the open step portion of the housing.
8. The combination according to claim 1,
    wherein the wall portion directly engages the open step portion of the housing.

* * * * *